US010175448B2

(12) United States Patent
Nadeau et al.

(10) Patent No.: US 10,175,448 B2
(45) Date of Patent: Jan. 8, 2019

(54) SLOTTED CONFIGURATION FOR OPTIMIZED PLACEMENT OF MICRO-COMPONENTS USING ADHESIVE BONDING

(71) Applicant: Cisco Technology, Inc., San Jose, CA (US)

(72) Inventors: Mary Nadeau, Alburtis, PA (US); Vipulkumar Patel, Breinigsville, PA (US); Prakash Gothoskar, Allentown, PA (US); John Fangman, Leesport, PA (US); John Matthew Fangman, Reading, PA (US); Mark Webster, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/331,315

(22) Filed: Jul. 15, 2014

(65) Prior Publication Data
US 2014/0362457 A1 Dec. 11, 2014

Related U.S. Application Data

(63) Continuation of application No. 12/955,011, filed on Nov. 29, 2010, now Pat. No. 8,836,100.
(Continued)

(51) Int. Cl.
G02B 7/02 (2006.01)
H01L 23/544 (2006.01)
(Continued)

(52) U.S. Cl.
CPC .......... *G02B 7/025* (2013.01); *G02B 6/4228* (2013.01); *G02B 6/4239* (2013.01); *G02B 7/003* (2013.01);
(Continued)

(58) Field of Classification Search
CPC ...... G02B 7/025; G02B 6/4228; G02B 7/003; H01L 23/544; H01L 24/83
(Continued)

(56) References Cited

U.S. PATENT DOCUMENTS 5,789,278 A 8/1998 Akram et al.
6,215,946 B1 4/2001 Sherrer
(Continued)

FOREIGN PATENT DOCUMENTS

CN 101442062 A 5/2009
EP 1143519 A2 10/2001
(Continued)

OTHER PUBLICATIONS

Myati, Chris et al., Optical Fabrication: Optical Contacting Grows More Robust, LaserFocusWorld, Jan. 1, 2006, PennWell Corporation, Tulsa, United States.
(Continued)

Primary Examiner — Robert Huber
(74) Attorney, Agent, or Firm — Patterson + Sheridan, LLP

(57) ABSTRACT

An arrangement for improving adhesive attachment of micro-components in an assembly utilizes a plurality of parallel-disposed slots formed in the top surface of the substrate used to support the micro-components. The slots are used to control the flow and "shape" of an adhesive "dot" so as to quickly and accurately attach a micro-component to the surface of a substrate. The slots are formed (preferably, etched) in the surface of the substrate in a manner that lends itself to reproducible accuracy from one substrate to another. Other slots ("channels") may be formed in conjunction with the bonding slots so that extraneous adhesive material will flow into these channels and not spread into unwanted areas.

18 Claims, 5 Drawing Sheets

Related U.S. Application Data

(60) Provisional application No. 61/265,459, filed on Dec. 1, 2009.

(51) Int. Cl.
*G02B 6/42* (2006.01)
*G02B 7/00* (2006.01)
*H01L 23/34* (2006.01)
*H01L 23/00* (2006.01)

(52) U.S. Cl.
CPC ............ H01L 23/544 (2013.01); H01L 24/83 (2013.01); *H01L 23/345* (2013.01); *H01L 24/29* (2013.01); *H01L 24/32* (2013.01); *H01L 2223/54426* (2013.01); *H01L 2224/26175* (2013.01); *H01L 2224/2919* (2013.01); *H01L 2224/32225* (2013.01); *H01L 2224/83121* (2013.01); *H01L 2224/83143* (2013.01); *H01L 2224/83192* (2013.01); *H01L 2224/83234* (2013.01); *H01L 2224/83385* (2013.01); *H01L 2224/83862* (2013.01); *H01L 2924/14* (2013.01); *Y10T 428/24479* (2015.01)

(58) Field of Classification Search
USPC .......................................... 257/432, E31.127
See application file for complete search history.

(56) References Cited

U.S. PATENT DOCUMENTS

| | | | |
|---|---|---|---|
| 6,363,201 B2 | 3/2002 | Sherrer et al. | |
| 6,526,204 B1 | 2/2003 | Sherrer et al. | |
| 6,535,318 B1* | 3/2003 | Wood et al. | 359/225.1 |
| 6,774,415 B2 | 8/2004 | Fung | |
| 6,839,474 B2 | 1/2005 | Steinberg et al. | |
| 6,848,839 B2 | 2/2005 | Steinberg | |
| 6,932,521 B2 | 8/2005 | Campbell et al. | |
| 7,447,395 B2 | 11/2008 | Montgomery et al. | |
| 7,825,501 B2 | 11/2010 | Zhu et al. | |
| 7,943,411 B2 | 5/2011 | Martin et al. | |
| 2002/0115200 A1 | 8/2002 | Zou et al. | |
| 2004/0058475 A1 | 3/2004 | Freund et al. | |
| 2004/0132291 A1 | 7/2004 | Lee et al. | |
| 2005/0194840 A1 | 9/2005 | Mori et al. | |
| 2006/0084254 A1 | 4/2006 | Attarwala | |
| 2006/0199297 A1* | 9/2006 | Kim et al. | 438/52 |
| 2006/0220036 A1 | 10/2006 | Lee et al. | |
| 2006/0221586 A1 | 10/2006 | Yang | |
| 2008/0035948 A1* | 2/2008 | Shin | H01L 24/29 257/99 |
| 2008/0122088 A1 | 5/2008 | Todd et al. | |
| 2009/0134483 A1* | 5/2009 | Weng et al. | 257/432 |
| 2009/0294932 A1* | 12/2009 | Sahasrabudhe et al. | 257/666 |
| 2010/0072555 A1 | 3/2010 | Meng et al. | |
| 2011/0127633 A1 | 6/2011 | Nadeau et al. | |

FOREIGN PATENT DOCUMENTS

| | | |
|---|---|---|
| GB | 2310052 A | 8/1997 |
| GB | 2370012 A | 6/2002 |
| WO | 2004081629 A1 | 9/2004 |
| WO | 2006/081606 A1 | 8/2006 |

OTHER PUBLICATIONS

Supplementary Eurporean Search Report for Application No. EP10834989, dated Nov. 17, 2017.

* cited by examiner

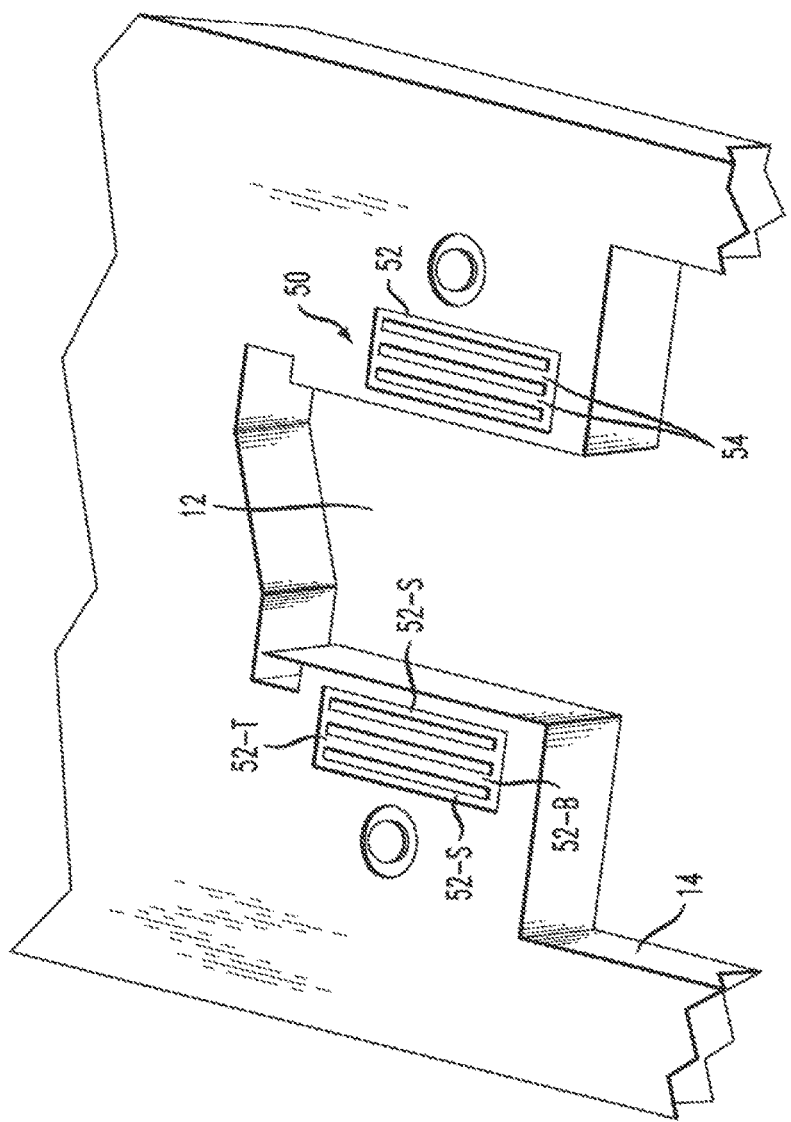

SLOTTED CONFIGURATION FOR OPTIMIZED PLACEMENT OF MICRO-COMPONENTS USING ADHESIVE BONDING

CROSS-REFERENCE TO RELATED APPLICATIONS

This application is a continuation of co-pending U.S. patent application Ser. No. 12/955,011, filed Nov. 29, 2010, which claims priority of U.S. provisional patent application Ser. No. 61/265,459, filed Dec. 1, 2009. The aforementioned related patent applications are herein incorporated by reference in their entirety.

TECHNICAL FIELD

The present invention relates to an arrangement for improving adhesive attachment of micro-components in an assembly and, more particularly, to the utilization of specific slotted configurations formed within a surface to which a micro-component is to be attached to improve the quality of the adhesive attachment as well as the accuracy of the positioning of the micro-component with respect to the rest of the assembly.

BACKGROUND OF THE INVENTION

In many integrated circuit multi-component arrangements, there is often a need to utilize epoxy (or any other appropriate adhesive) to join one component to another during various assembly and/or packaging operations. Indeed, and for the purposes of the present discussion, it will be presumed that the joining relates to attaching a micro-component to a supporting substrate. The need to attach a micro-component to a substrate is a common process step in electronic integrated circuit assemblies, optical system subassemblies, opto-electronic arrangements, and the like.

As the size of these micro-components continues to shrink, the need to place the elements with improved alignment accuracy increases. This is particularly true in optical or opto-electronic arrangements, where one or more micro-components forms part of an optical signal path that requires inter-component alignment to maintain the integrity of the signal path. For example, in a silicon photonic assembly, components such as micro-lenses and optical fibers need to be aligned to one another with sub-100 nm positional accuracy as they are attached to a common substrate, such as a silicon-on-insulator (SOI) substrate.

While the ability to accurately place these micro-components on a substrate is a necessary requirement, the maintenance of these positions over the lifetime of the assembly is also important. It is quite possible that a given assembly will be subjected to variations in temperature, humidity and the like over its lifetime, where these environmental changes may degrade the quality of the adhesive bond and cause one component to shift relative to another. One way to address the lifetime issue is to utilize as thin a bond line as possible in the original attachment process (a "bond line" being defined as the thickness of the adhesive between the two surfaces being bonded). It has been found that bond lines on the order of tens of microns will increase the lifetime stability of micro-component assemblies. However, this relatively thin bond line has presented problems in terms of the friction-based restriction of the flow of the adhesive (i.e., molecular flow regime), associated with the relatively large surface areas to be joined relative to the total volume (relatively small) of the adhesive. This frictional problem associated with the small amount of adhesive material then also limits the amount of postplacement adjustment of the micro-component that may be performed, eliminating the possibility of performing active or quasi-active alignment in many optical or opto-electronic systems.

Arrangements exist in the prior art for addressing various issues related to joining components using an epoxy or other adhesive. U.S. Patent Publication 2009/0115039 issued to Z. Zhu et al. on May 7, 2009 is associated with controlling the bond line thickness of the epoxy used in semiconductor device attachments. The Zhu et al. arrangement, however, is concerned with creating relatively "thick" bond lines (as opposed to the "thin" lines desired in the present circumstances) and uses boundary walls around the perimeter of a bonding area to serve as a dam to prevent the epoxy from flowing into unwanted areas.

Many other references exist in the art related to preventing the flow of epoxy into unwanted areas, forming 'wick-stop' trenches and the like. U.S. Pat. No. 6,526,204 issued to D. W. Sherrer et al. on Feb. 25, 2003 is exemplary of this technology, where a trench is formed in a direction "away" from an optical signal path/fiber supporting groove. Thus, any overflow amounts of epoxy will be directed out of the signal path and into wick-stop trench.

These trenches, however, are of limited use in situations where there are multiple components that need to be placed in close proximity. That is, there are many system arrangements where the inclusion of one or more wick-stop trenches requires too much valuable surface area in the arrangement.

A need therefore remains for an arrangement for better controlling the application and control of an adhesive used to join a micro-component to a substrate.

SUMMARY OF THE INVENTION

One embodiment of the present disclosure is a substrate including a first section and a second section. The first section includes a first plurality of slots extending from a top surface of the substrate to a first depth in the substrate and a first channel surrounding a periphery of the first plurality of slots where the first channel extends from the top surface to the first depth. Moreover, the first plurality of slots and first channel contain a first liquid adhesive material suitable for providing bonding of a component to the substrate. The second section includes a second plurality of slots extending from the top surface to a second depth in the substrate and a second channel surrounding a periphery of the second plurality of slots where the second channel extends from the top surface to the second depth. Moreover, the second plurality of slots and second channel contain a second liquid adhesive material.

Another embodiment disclosed herein is an optical system that includes a substrate and an optical component. The substrate includes a first section that includes a first plurality of slots extending from a top surface of the substrate to a first depth in the substrate where the first plurality of slots contains a first liquid adhesive material. The substrate also includes a second section that includes a second plurality of slots extending from the top surface of the substrate to a second depth in the substrate where the second plurality of slots contains a second liquid adhesive material. The substrate also includes an intermediate section including a recess extending from the top surface to a third depth in the substrate greater than the first and second depths. The optical component is coupled to the substrate via the first and second liquid adhesive materials disposed in the first and second plurality of slots. The optical component includes an arm portion that at least partially extends into the recess of the intermediate section.

BRIEF DESCRIPTION OF THE DRAWINGS

Referring now to the drawings, where like numerals represent like parts in several views:

FIG. 8 is an isometric view of yet another embodiment of the present invention, utilizing a plurality of slots in combination with a peripheral guard channel surrounding the slots.

DETAILED DESCRIPTION

Figure 1:
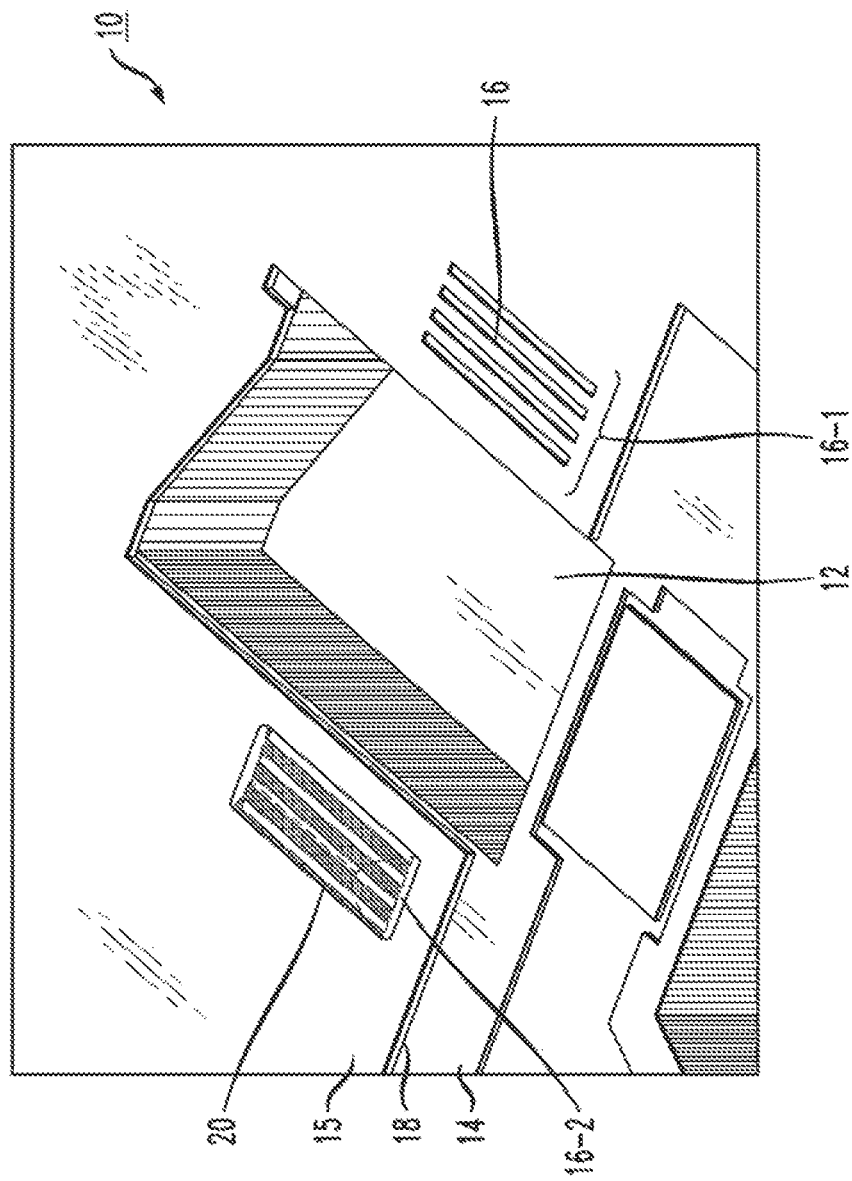
FIG. 1 is an isometric view of a portion of an optical system utilizing pluralities of slots to form adhesive dots in accordance with the present invention.

FIG. 1 is an isometric view of a portion of a silicon-on-insulator (SOI) optoelectronic assembly 10 that is suitable for using the slotted attachment arrangement of the present invention. Assembly 10 includes an etched cavity 12 that is formed in a substrate 14 and used to support a micro-component such as a lens (not shown). In accordance with the present invention, a plurality of slots 16 are formed in a top surface 18 of substrate 14. In one embodiment, a dielectric layer 15 may be disposed across the surface of substrate 14 and slots 16 etched into dielectric layer 15 using standard CMOS lithographic techniques. While the focus of the following discussion utilizes an optical assembly as an example, it is to be understood that the use of groups of slots to provide attachment of a micro-component to a substrate is useful in electrical integrated circuit systems, optical systems or opto-electronic systems.

In the specific arrangement shown in FIG. 1, the plurality of slots 16 comprise a first plurality of slots 16-1 disposed on one side of cavity 12 and a second plurality of slots 16-2 disposed on the opposite side of cavity 12. An adhesive "dot" 20 (such as a prescribed volume of epoxy or any other suitable, flowable adhesive material) is shown as being dispensed onto slots 16-2. The utilization of a plurality of slots of a predefined length and depth (as well as inter-slot spacing), in accordance with the present invention, allows for the quantity of liquid adhesive to naturally take the shape of the slots as a result of surface tension properties.

Figure 2:
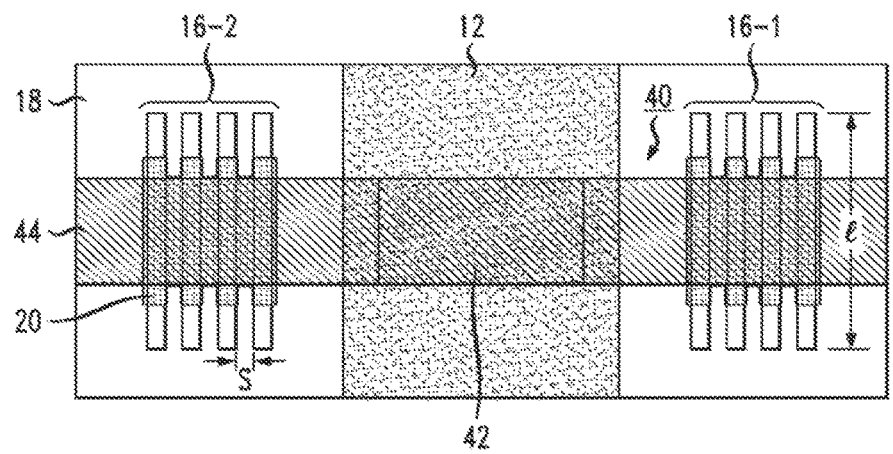
FIG. 2 is a top view, in diagrammatic form, of the arrangement of FIG. 1, with a micro-component positioned to be attached to the optical substrate.

FIG. 2 is a top view, in block diagram form, of the arrangement of FIG. 1, in this case with a micro-component 40 disposed to both fit into cavity 12 and span across slots 16-1 and 16-2 formed in top surface 18 of substrate 14 (particularly, through dielectric layer 15 disposed over substrate 14). The length l and inter-slot spacing S associated with slots 16 is shown in FIG. 2. While in this particular example each slot is formed to comprise approximately the same length and is etched to approximately the same depth, it is to be understood that in its most general embodiment, the slots may comprise varying lengths, depths and spacings, as long as they function to contain the flow of the adhesive material to a region suitable for the attachment of a specific micro-component. Adhesive 20 (such as an epoxy) is shown as the shaded material disposed along and within slots 16. In this example, micro-component 40 comprises an optical lens 42 disposed within a lens holder 44, where the lens itself is positioned to reside within cavity 12 and holder 44 spans across the cavity and is joined to substrate 14 through the use of adhesive 20 disposed along slots 16-1 and 16-2.

Figure 3:
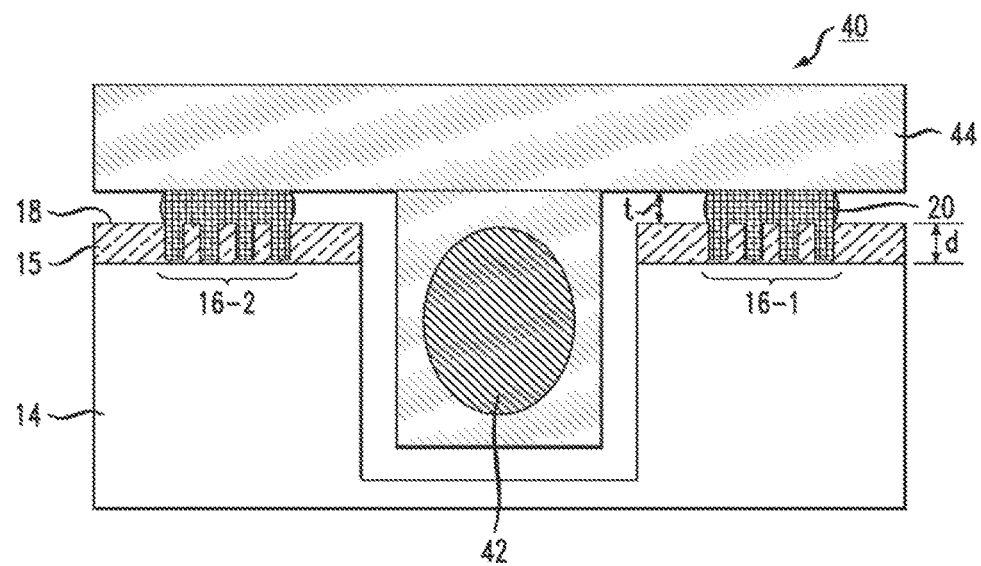
FIG. 3 is a side view of the arrangement of FIG. 2.

The depth d of the created slots 16 is particularly illustrated in FIG. 3. Again, in this example, each slot is etched to the same depth d and is defined as the thickness of dielectric layer 15 since silicon substrate 14 can be used as an etch stop for the process of forming slots 16. In its most general form, the slots may be formed to various depths. Indeed, as will be discussed below, channels may be associated with the slots and may be etched deeper into the substrate. The thickness d of an individual bond line is also shown in this view. In accordance with the present invention, the number of individual slots used to form a given plurality of slots, their length l and spacing S, as well as the depth d of the individual slots, can be designed to increase the ratio of the adhesive volume to the bonding surface area, while maintaining a very thin (i.e., on the order often microns or less) bond line in the region of the bond. The size, shape and number of slots may also be optimized to address various fabrication/process issues such as cycle time, yield and cost requirements of a particular assembly. It is an advantage of the use of slots in accordance with the present invention that when a micro-component (such as lens holder 44) is pressed into position over adhesive dots 20, the presence of slots 16 will allow for the adhesive to be retained and spread in a guided fashion.

Figure 4:
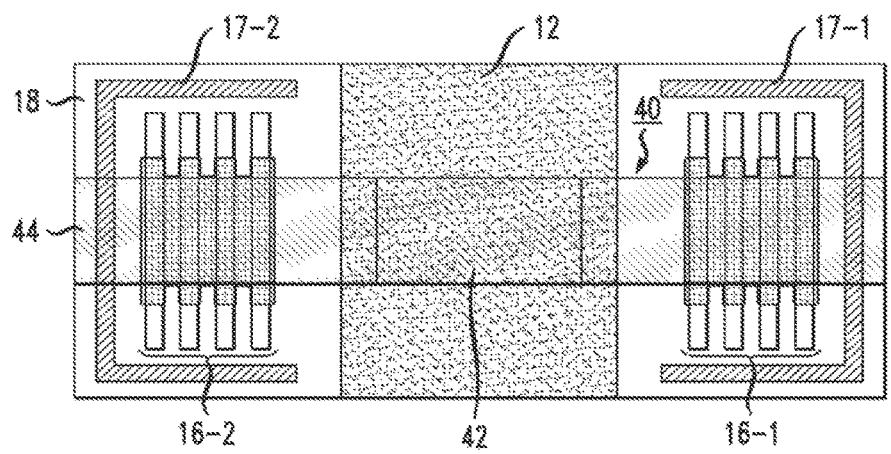
FIGS. 4 and 5 are alternative embodiments of the views of FIGS. 2 and 3, respectively, illustrating the inclusion of channels for containment of overflow adhesive.
Figure 5:
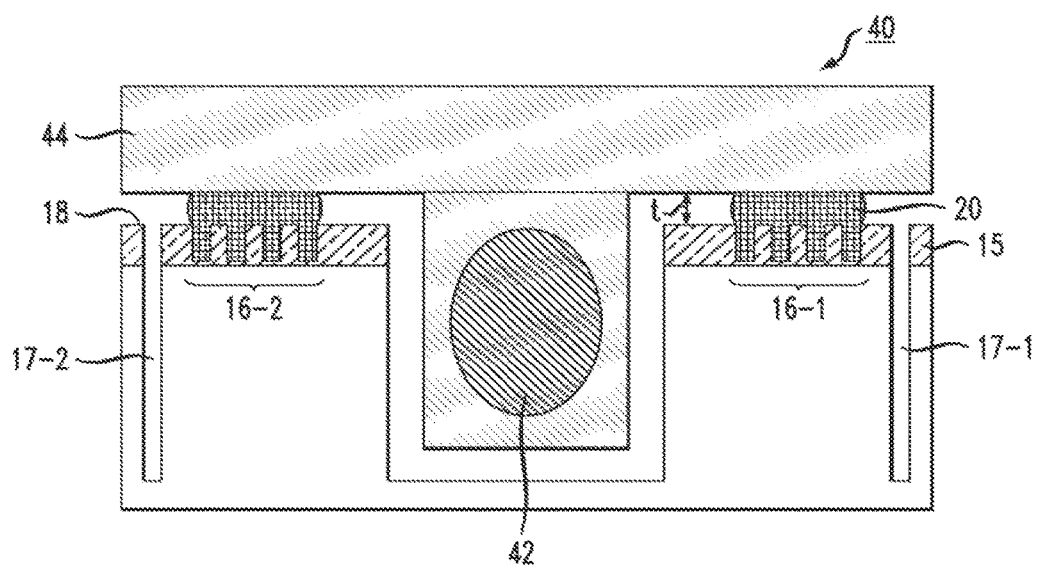

In another embodiment of the present invention, one or more channels may be formed in conjunction with a plurality of slots, where the channels are used to capture overflow adhesive and prevent the flow of the adhesive material into unwanted areas. FIGS. 4 and 5 are top and side views, respectively, of the arrangement of FIGS. 2 and 3, where an overflow channel 17 is formed in conjunction with slots 16. In this particular embodiment, overflow channel 17 is formed to extend a greater depth into substrate 14. This is considered as a design choice only and, the depth of the overflow channel may alternatively be on the same order as the slots themselves. As with slots 16, channel 17 may be formed using an etching process well-known in CMOS processing (such as deep RIE etching, plasma etching or the like) or any other suitable process. Referring to FIGS. 4 and 5, channels 17 are positioned with respect to slots 16 so that any overflow adhesive 20 will naturally drain into channels 17 and not otherwise spread into unwanted areas across surface 18 of substrate 14.

Figure 6:
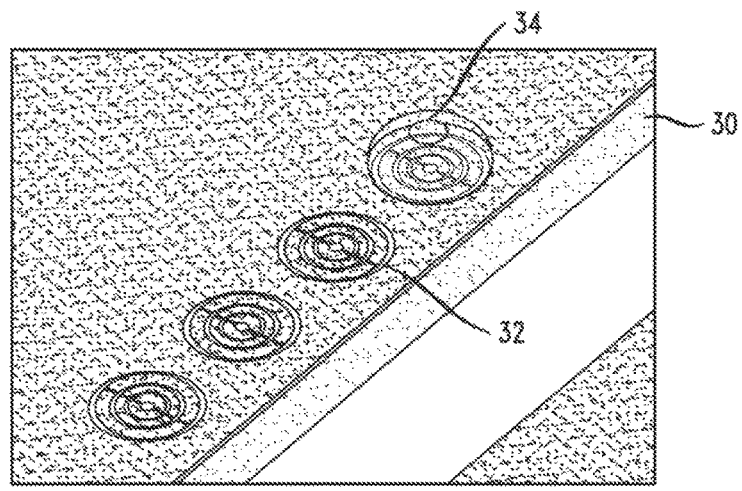
FIG. 6 is an isometric view of an alternative embodiment of the present invention, in this case using a plurality of slots formed in a particular configuration to mimic the surface area of a micro-component being attached to a substrate, the configuration allowing for the micro-component to self-center over an adhesive dot dispensed onto the slots.

As mentioned above, it is a significant aspect of the present invention that the use of slots that may be easily etched in the surface of supporting substrate allows for variously-shaped "dots" of adhesive to be formed, promoting self-centering alignment of a micro-component to the substrate. FIG. 6 illustrates a portion of a different SOI assembly 30, in this case including slots 32 that are formed in a plurality of concentric circles. A dispensed volume of adhesive 34, as shown, will then take on a hemispherical shape, following the contour of the circular base created by slots 32. A specific micro-component (not shown) having a topology in the form of a circular bottom surface will then naturally self-center upon being inserted in place on adhesive 34.

Figure 7:
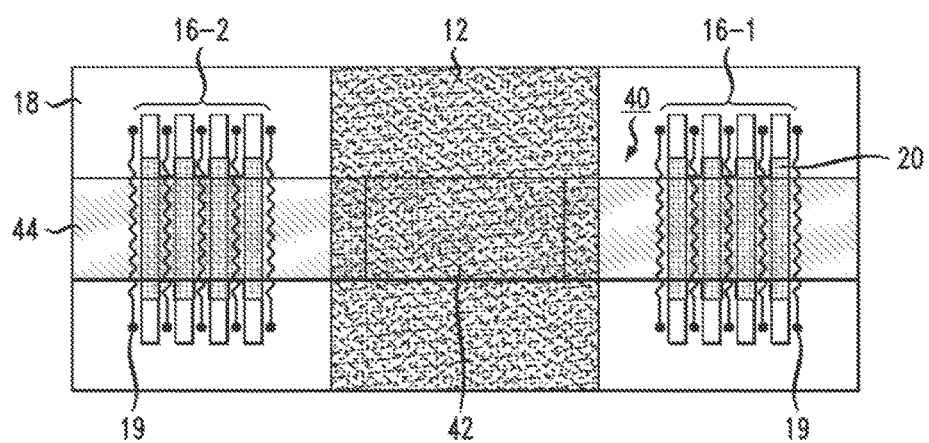
FIG. 7 is a top view of yet another embodiment of the present invention, in this case incorporating a plurality of heater elements with the slots, where localized heating of the adhesive may be useful in controlling the curing of the adhesive.

It is possible to modify the properties of an applied adhesive by changing its temperature. In accordance with another embodiment of the present invention, one or more heater elements (such as resistive strips) may be formed in conjunction with the bond slots and used to change the temperature in the local region of the adhesive. FIG. 7 is a top view of this embodiment of the present invention, showing a plurality of resistive strips 19 disposed in conjunction with slots 16. Materials such as silicon, polysilicon, silicides or metals may be used to form these heater elements. Through additional circuitry (not shown), a current may be passed through strips 19 which will then raise the local temperature in the vicinity of slots 16. Although FIG. 7 shows the use of heater elements positioned adjacent to slots 16, it is also possible to embed a heater element with the slots themselves.

By allowing for the heated adhesive to remain in a viscous state, the position of a micro-component disposed over the adhesive may be adjusted until the desired degree of alignment with respect to the substrate has been achieved. Once the micro-component has been properly aligned, the heater element(s) may also be utilized to activate curing. Additionally, the inclusion of heater elements can be used to provide "local" curing, by turning "on" various ones of the heater elements in a controlled manner. Indeed, by controlling the turning "on" and "off" of strips 19, a number of separate micro-components may be positioned on a common substrate, with the adhesion of each micro-component performed in a preferred sequence by controlling the temperature of the adhesive in the local area of each micro-component.

FIG. 8 is an isometric view of an alternative embodiment of the present invention in conjunction with the same assembly configuration (substrate 14, cavity 12 and the like) described in association with the above figures. In this case, the attachment configuration 50 comprises a channel 52 formed around the outer periphery of slots 54 to assist in retaining the liquid adhesive in place. Channel 52 surrounds the edges of slots 54 and is shown as comprising a top channel portion 52-T, a bottom channel portion 52-B and side channel portions 52-S.

In general, the adhesive-bearing slots of the present invention are shown to allow for the controllable and uniform spread of the adhesive material in predefined (and confined) areas of interest for bonding. The ability to form a plurality of these slots in a relatively small area has been found to reduce surface friction and allow for the formation of thin bond lines. The presence of the slots themselves increases the surface area/roughness for improving the post-cure joint strength. When used with filled epoxy material, the slots provide additional resistance to movement of the epoxy after curing.

As particularly shown in the illustration of FIG. 6, the ability to form various configurations of the slots allow for the attached component to self-center, providing for (essentially) passive alignment of components to a substrate. Although not explicitly shown, it is further to be understood that the heater elements described above may be used with any slot configuration, including the concentric circular slot arrangement of FIG. 6.

Lastly, while the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the claims appended hereto.

The invention claimed is:

1. A silicon-on-insulator substrate, comprising:
   a first section, comprising:
      a first plurality of parallel-disposed slots extending from a top surface of a dielectric layer to a first depth in the dielectric layer such that the plurality of parallel-disposed slots is present only in the dielectric layer, wherein the dielectric layer contacts a silicon layer in the substrate,
      a first closed circular slot, and
      a first channel surrounding a periphery of the first plurality of slots, the first channel having a first channel length longer than a first channel width, wherein the first channel extends from the top surface to the first depth,
      wherein the first plurality of slots, the first channel, and the first closed circular slot are configured to contain a first adhesive material suitable for providing bonding of a component to the substrate, and
      wherein a first side and a second side of each of the first plurality of slots both directly connect to the first channel, wherein the first side is opposite the second side;
   a second section, comprising:
      a second plurality of parallel-disposed slots extending only from the top surface to a second depth in the dielectric layer,
      a second closed circular slot, and
      a second channel surrounding a periphery of the second plurality of slots, the second channel having a second channel length longer than a second channel width, wherein the second channel extends from the top surface to the second depth,
      wherein the second plurality of slots, the second channel, and the second closed circular slot are configured to contain a second adhesive material; and
   an intermediate section between the first and second sections, comprising:
      a recess having a recess width wider than at least one of a combined width of the first plurality of slots and a combined width of the second plurality of slots, wherein the recess extends from the top surface through the dielectric layer to a third depth in the substrate greater than the first and second depths, wherein the length of the recess is longer than the first channel length and the second channel length.

2. The substrate of claim 1, wherein the first depth is equivalent to the second depth.

3. The substrate of claim 1, wherein a length of the recess is greater than respective lengths of the first and second pluralities of slots.

4. An optical system, comprising:
   a substrate, comprising:
      a first section comprising a first plurality of slots extending from a top surface of the substrate to a first depth in the substrate, wherein the first plurality of slots contain a first adhesive material, a second section comprising a second plurality of slots extending from the top surface of the substrate to a second depth in the substrate, wherein the second plurality of slots contain a second adhesive material, and an intermediate section comprising a recess extending from the top surface to a third depth in the substrate greater than the first and second depths; and an optical component bonded to the substrate via the first and second adhesive materials disposed in the first and second plurality of slots, the optical component comprising an arm portion that at least partially extends into the recess of the intermediate section, wherein the first section further comprises a first closed circular slot, wherein the second section further comprises a second closed circular slot, wherein the first closed circular slot is configured to contain the first adhesive material, and the second closed circular slot is configured to contain the second adhesive material.

5. The optical system of claim 4, wherein the arm portion comprises a lens arranged perpendicular to the top surface such that light travels through the lens parallel to the top surface, wherein at least a portion of the lens is within the recess.

6. The optical system of claim 4, wherein the arm portion does not directly contact the substrate.

7. The optical system of claim 4, wherein the first section comprises a first channel surrounding a periphery of the first plurality of slots, the first channel extending from the top surface to the first depth, and wherein the second section comprises a second channel surrounding a periphery of the second plurality of slots, the second channel extending from the top surface to the second depth.

8. The optical system of claim 4, wherein the first and second depths are the same.

9. The optical system of claim 7, wherein the first plurality of slots and second plurality of slots comprise parallel-disposed slots.

10. The optical system of claim 9, wherein a first side and a second side of the parallel-disposed slots of the first plurality both connect to the first channel, wherein the first side is opposite the second side.

11. The optical system of claim 4, wherein the substrate comprises a silicon-on-insulator substrate.

12. The optical system of claim 11, wherein the first and second pluralities of slots are formed in a dielectric layer disposed over the silicon-on-insulator substrate.

13. The optical system of claim 4, wherein a length of the recess is greater than respective lengths of the first and second pluralities of slots.

14. The optical system of claim 4, wherein the optical component is bonded to the substrate via the first and second adhesive materials, wherein the first and second adhesive materials directly bond to the substrate as a result of a curing process applied to a liquid adhesive, wherein the liquid adhesive bonds to the substrate and forms the first and second adhesive materials.

15. The optical system of claim 4, wherein the first adhesive material extends continuously from respective bottom surfaces of the first plurality of slots at the first depth until the first adhesive material contacts the optical component and the second adhesive material extends continuously from respective bottom surfaces in the second plurality of slots at the second depth until the second adhesive material contacts the optical component.

16. The optical system of claim 15, wherein the optical component does not contact the substrate.

17. The optical system of claim 4, wherein:
the recess further comprises a recess width wider than at least one of a width of the first plurality of slots and a width of the second plurality of slots.

18. The optical system of claim 4, wherein the recess is longer than the optical component.

* * * * *